United States Patent
Shukla et al.

(10) Patent No.: US 7,579,619 B2
(45) Date of Patent: Aug. 25, 2009

(54) N,N'-DI(ARYLALKYL)-SUBSTITUTED NAPHTHALENE-BASED TETRACARBOXYLIC DIIMIDE COMPOUNDS AS N-TYPE SEMICONDUCTOR MATERIALS FOR THIN FILM TRANSISTORS

(75) Inventors: Deepak Shukla, Webster, NY (US); Shelby F. Nelson, Pittsford, NY (US); Diane C. Freeman, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 325 days.

(21) Appl. No.: 11/110,076

(22) Filed: Apr. 20, 2005

(65) Prior Publication Data
US 2006/0237712 A1 Oct. 26, 2006

(51) Int. Cl.
*H01L 35/24* (2006.01)

(52) U.S. Cl. .......... 257/40; 257/E51.005; 257/E51.006; 257/E51.05

(58) Field of Classification Search .......... 257/40, 257/E51.005, E51.006, E51.05
See application file for complete search history.

(56) References Cited

U.S. PATENT DOCUMENTS

| 4,468,444 | A | 8/1984 | Contois |
| 4,611,385 | A | 9/1986 | Forrest et al. |
| 5,347,144 | A | 9/1994 | Garnier et al. |
| 6,127,076 | A * | 10/2000 | Ishigami et al. ............ 430/58.5 |
| 6,387,727 | B1 * | 5/2002 | Katz et al. .................... 438/99 |
| 2002/0164835 | A1 | 11/2002 | Dimitrakopoulos et al. |
| 2005/0142472 | A1 * | 6/2005 | Sekido et al. ............ 430/58.05 |
| 2005/0176970 | A1 | 8/2005 | Marks et al. |

FOREIGN PATENT DOCUMENTS

| EP | 0 031 065 | 12/1979 |
| WO | 85/04985 | 11/1985 |

OTHER PUBLICATIONS

Theo J. Dingemans, et al., "Wholly Aromatic Ether-imides; Potential Materials for n-Type Semiconductors," Chem. Mater. 2004, 16, 966-974.

* cited by examiner

*Primary Examiner*—Anh Phung
*Assistant Examiner*—Michael Lulis
(74) *Attorney, Agent, or Firm*—J. Lanny Tucker

(57) ABSTRACT

A thin film transistor comprises a layer of organic semiconductor material comprising a tetracarboxylic diimide naphthalene-based compound having, attached to each of the imide nitrogen atoms, a substituted or unsubstituted arylalkyl moiety. Such transistors can further comprise spaced apart first and second contact means or electrodes in contact with said material. Further disclosed is a process for fabricating an organic thin-film transistor device, preferably by sublimation deposition onto a substrate, wherein the substrate temperature is no more than 100° C.

11 Claims, 1 Drawing Sheet

N,N'-DI(ARYLALKYL)-SUBSTITUTED NAPHTHALENE-BASED TETRACARBOXYLIC DIIMIDE COMPOUNDS AS N-TYPE SEMICONDUCTOR MATERIALS FOR THIN FILM TRANSISTORS

FIELD OF THE INVENTION

The present invention relates to the use N,N'-bis[arylalkyl] naphthalene-1,4,5,8-bis(dicarboximide) compounds as semiconductor materials in n-channel semiconductor films for thin film transistors. The invention relates to the use of these materials in thin film transistors for electronic devices and methods of making such transistors and devices.

BACKGROUND OF THE INVENTION

Thin film transistors (TFTs) are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to relatively low speed devices, however, since its maximum mobility (0.5-1.0 $cm^2/V$ sec) is about a thousand times smaller than that of crystalline silicon.

Although amorphous silicon is less expensive than highly crystalline silicon for use in TFTs, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

In the past decade, organic materials have received attention as a potential alternative to inorganic materials such as amorphous silicon for use in semiconductor channels of TFTs. Organic semiconductor materials are simpler to process, especially those that are soluble in organic solvents and, therefore, capable of being applied to large areas by far less expensive processes, such as spin coating, dip coating and microcontact printing. Furthermore organic materials may be deposited at lower temperatures, opening up a wider range of substrate materials, including plastics, for flexible electronic devices. Accordingly, thin film transistors made of organic materials can be viewed as a potential key technology for plastic circuitry in display drivers, portable computers, pagers, memory elements in transaction cards, and identification tags, where ease of fabrication, mechanical flexibility, and/or moderate operating temperatures are important considerations.

Organic materials for use as potential semiconductor channels in TFTs are disclosed, for example, in U.S. Pat. No. 5,347,144 to Garnier et al., entitled "Thin-Layer Field-Effect Transistors with MIS Structure Whose Insulator and Semiconductors Are Made of Organic Materials."

Considerable efforts have been made to discover new organic semiconductor materials that can be used in TFTs to provide the switching and/or logic elements in electronic components, many of which require significant mobilities, well above 0.01 $cm^2/Vs$, and current on/off ratios (hereinafter referred to as "on/off ratios") greater than 1000. Organic TFTs having such properties are capable of use for electronic applications such as pixel drivers for displays and identification tags. Most of the compounds exhibiting these desirable properties are "p-type" or "p-channel," however, meaning that negative gate voltages, relative to the source voltage, are applied to induce positive charges (holes) in the channel region of the device.

As an alternative to p-type organic semiconductor materials, N-type organic semiconductor materials can be used in TFTs as an alternative to p-type organic semiconductor materials, where the terminology "n-type" or "n-channel" indicates that positive gate voltages, relative to the source voltage, are applied to induce negative charges in the channel region of the device.

Moreover, one important type of TFT circuit, known as a complementary circuit, requires an n-type semiconductor material in addition to a p-type semiconductor material. See Dodabalapur et al. in "Complementary circuits with organic transistors" *Appl. Phys. Lett.* 1996, 69, 4227. In particular, the fabrication of complementary circuits requires at least one p-channel TFT and at least one n-channel TFT. Simple components such as inverters have been realized using complementary circuit architecture. Advantages of complementary circuits, relative to ordinary TFT circuits, include lower power dissipation, longer lifetime, and better tolerance of noise. In such complementary circuits, it is often desirable to have the mobility and the on/off ratio of an n-channel device similar in magnitude to the mobility and the on/off ratio of a p-channel device. Hybrid complementary circuits using an organic p-type semiconductor and an inorganic n-type semiconductor are known, as described in Dodabalapur et al. (*Appl. Phys. Lett.* 1996, 68, 2264.), but for ease of fabrication, an organic n-channel semiconductor material would be desired in such circuits.

Only a limited number of organic materials have been developed for use as a semiconductor n-channel in TFTs. One such material, buckminsterfullerene C60, exhibits a mobility of 0.08 $cm^2/Vs$ but is considered unstable in air. See R. C. Haddon, A. S. Perel, R. C. Morris, T. T. M. Palstra, A. F. Hebard and R. M. Fleming, "$C_{60}$ Thin Film Transistors" *Appl. Phys. Let.* 1995, 67, 121. Perfluorinated copper phthalocyanine has a mobility of 0.03 $cm^2/Vs$, and is generally stable to air operation, but substrates must be heated to temperatures above 100° C. in order to maximize the mobility in this material. See "New Air-Stable n-Channel Organic Thin Film Transistors" Z. Bao, A. J. Lovinger, and J. Brown *J. Am. Chem, Soc.* 1998, 120, 207. Other n-channel semiconductors, including some based on a naphthalene framework, have also been reported, but with lower mobilities. See Laquindanum et al., "n-Channel Organic Transistor Materials Based on Naphthalene Frameworks," *J. Am. Chem, Soc.* 1996, 118, 11331. One such naphthalene-based n-channel semiconductor material, tetracyanonaphthoquino-dimethane (TCNNQD), is capable of operation in air, but the material has displayed a low on/off ratio and is also difficult to prepare and purify.

Aromatic tetracarboxylic diimides, based on a naphthalene aromatic framework, have also been demonstrated to provide, as an n-type semiconductor, n-channel mobilities up to 0.16 $cm^2/Vs$ using top-contact configured devices where the source and drain electrodes are on top of the semiconductor. Comparable results could be obtained with bottom contact devices, that is, where the source and drain electrodes are underneath the semiconductor, but a thiol underlayer needed to be applied between the electrodes, which had to be gold, and the semiconductor. See Katz et al. "Naphthalenetetracarboxylic Diimide-Based n-Channel Transistor Semiconductors: Structural Variation and Thiol-Enhanced Gold Contacts" *J. Am. Chem. Soc.* 2000 122, 7787; "A Soluble and Air-stable Organic Semiconductor with High Electron Mobility" *Nature* 2000 404, 478; Katz et al., European Patent Application EP1041653 or U.S. Pat. No. 6,387,727. In the absence of the thiol underlayer, the mobility of the compounds of Katz et al. was found to be orders of magnitude lower in bottom-contact devices. U.S. Pat. No. 6,387,727 B1 to Katz et al. discloses fused-ring tetracarboxylic diimide compounds, one example of which is N,N'-bis(4-trifluoromethyl benzyl)naphthalene-1,4,58,-tetracarboxylic acid diimide. Such compounds are pigments that are easier to reduce. The highest mobilities reported in U.S. Pat. No. 6,387,727 B1 to Katz et al. was between 0.1 and 0.2 $cm^2/Vs$, for N,N'-dioctyl naphthalene-1,4,5,8-tetracarboxylic acid diimide.

Relatively high mobilities have been measured in films of naphthalene tetracarboxylic diimides having linear alkyl side chains using pulse-radiolysis time-resolved microwave conductivity measurements. See Struijk et al. "Liquid Crystalline Perylene Diimides: Architecture and Charge Carrier Mobilities" *J. Am. Chem. Soc.* Vol. 2000, 122, 11057.

US Patent Pub. No. 2002/0164835 A1 to Dimitrakopoulos et al. discloses improved n-channel semiconductor films made of perylene tetracarboxylic acid diimide compounds, as compared to naphthalene-based compounds, one example of which is N,N'-di(n-1H,1H-perfluorooctyl) perylene-3,4,9,10-tetracarboxylic acid diimide. Substituents attached to the imide nitrogens in the diimide structure comprise alkyl chains, electron deficient alkyl groups, electron deficient benzyl groups, the chains preferably having a length of four to eighteen atoms. Devices based on materials having a perylene framework used as the organic semiconductor have led to low mobilities, for example $10^{-5}$ $cm^2/Vs$ for perylene tetracarboxylic dianhydride (PTCDA) and $1.5 \times 10^{-5}$ $cm^2/vs$ for NN'-diphenyl perylene tetracarboxylic acid diimide (PTCDI-Ph). See Horowitz et al. in "Evidence for n-Type Conduction in a Perylene Tetracarboxylic Diimide Derivative" *Adv. Mater.* 1996, 8, 242 and Ostrick, et al. *J. Appl. Phys.* 1997, 81, 6804.

As discussed above, a variety of 1,4,5,8-naphthalenetetracarboxylic acid diimides have been made and tested for n-type semiconducting properties. In general, these materials, as an n-type semiconductor, have provided n-channel mobilities up to 0.16 $cm^2/Vs$ using top-contact configured devices. There is a need in the art for new and improved organic semiconductor materials for transistor materials and improved technology for their manufacture and use. There is especially a need for n-type semiconductor materials exhibiting significant mobilities and current on/off ratios in organic thin film transistor devices.

SUMMARY OF THE INVENTION

The present invention relates to n-channel semiconductor films for use in organic thin film transistors, of N,N'-di(arylalkyl) naphthalene tetracarboxylic diimide compounds having, attached to each of the two imide nitrogens, an arylalkyl group, wherein the aryl group, which may be substituted or unsubstituted, is attached via a divalent hydrocarbon to each imide nitrogen. Such films are capable of exhibiting, in the film form, the highest reported field-effect electron mobility, up to 5.0 $cm^2/Vs$ for known n-type compounds. Such semiconductor films are also capable of providing device on/off ratios in the range of at least $10^5$.

One embodiment of the present invention is directed to the use of such n-channel semiconductor films in organic thin film transistors each comprising spaced apart first and second contact means connected to an n-channel semiconductor film. A third contact means can be spaced from said first and second contact means and adapted for controlling, by means of a voltage applied to the third contact means, a current between the first and second contact means through said film. The first, second, and third contact means can correspond to a drain, source, and gate electrode in a field effect transistor.

Another aspect of the present invention is directed to a process for fabricating a thin film transistor, preferably by sublimation or solution-phase deposition of the n-channel semiconductor film onto a substrate, wherein the substrate temperature is at a temperature of no more than 100° C. during the deposition.

More particularly, the present invention is directed to an article comprising, in a thin film transistor, a thin film of organic semiconductor material that comprises an N,N'-di (arylalkyl)-substituted naphthalene-based tetracarboxylic diimide compound having a substituted or unsubstituted carbocyclic aromatic ring system attached to each imide nitrogen atom through a divalent hydrocarbon group, wherein any optional substituents on the aryl rings comprises at least one electron donating organic group, i.e., if one or more substituents are present on one or both of the two carbocyclic ring systems, such substituents comprise at least one electron donating group.

In one embodiment of the present invention, N,N'-di(arylalkyl) naphthalene-based tetracarboxylic diimide compounds are represented by the following structure:

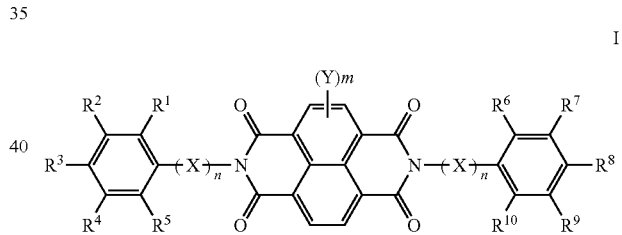

wherein, X is a divalent —$CH_2$— or alkyl-substituted —$CH_2$— divalent group, n=1, 2 or 3, and $R^1$, $R^2$, $R^3$, $R^4$, $R^5$ (on a first ring system, preferably a first phenyl ring) and $R^6$, $R^7$, $R^8$, $R^9$, and $R^{10}$ (on a second ring system, preferably a second phenyl ring) are each independently H or an electron donating organic group, wherein optionally any two adjacent R groups on a ring system can combine to form a fused aromatic, preferably a fused phenyl ring. Preferably, $R^1$, $R^2$, $R^3$, $R^4$, $R^5$, $R^6$, $R^7$, $R^8$, $R^9$, and $R^{10}$ on the aryl ring systems comprises at least one electron donating group, most preferably a C1-C8 alkyl substituent. Preferred organic groups include, for example, $CH_3$, linear or branched C2-C4 alkyl, C1-C8 alkylene (a monovalent unsaturated aliphatic hydrocarbon), or C1-C8 alkoxy.

It is preferred that at least two of $R^1$, $R^2$, $R^3$, $R^4$ and $R^5$ are H and at least two of $R^6$, $R^7$, $R^8$, $R^9$, and $R^{10}$ are H. More preferred structures are those in which at least three of $R^1$, $R^2$, $R^3$, $R^4$ and $R^5$ are H and at least three of $R^6$, $R^7$, $R^8$, $R^9$, and $R^{10}$ are H. Still more preferred structures are those in which either all of $R^1$, $R^3$, $R^4$, $R^5$, $R^6$, $R^8$, $R^9$, and $R^{10}$ are H, and both $R^2$ and $R^7$ is an electron donating group, preferably an alkyl group such as $CH_3$; or all of $R^2$, $R^3$, $R^4$, $R^5$, $R^7$, $R^8$, $R^9$, and $R^{10}$ are H, and both $R^1$ and $R^6$ are an electron donating group, preferably an alkyl group such as $CH_3$. Preferably, at least one of said aryl ring systems is substituted with a C1 to C4 containing alkyl group.

In the above Structure I, a first and second dicarboxylic imide moiety is attached on opposite sides of the naphthalene nucleus, at the 1,4 and 5,8 positions of the naphthalene nucleus. The naphthalene nucleus can be optionally substituted with up to four independently selected Y groups, wherein m is any integer from 0 to 4.

Advantageously, an n-channel semiconductor film used in a transistor device according to the present invention does not necessarily require, for obtaining high mobilities, prior treatment of the first and second contact means connected to the film. Furthermore, the compounds used in the present invention possess significant volatility so that vapor phase deposition, where desired, is available to apply the n-channel semiconductor films to a substrate in an organic thin film transistor.

As used herein, "a" or "an" or "the" are used interchangeably with "at least one," to mean "one or more" of the element being modified.

As used herein, the terms "over," "above," and "under" and the like, with respect to layers in the organic thin film transistor, refer to the order of the layers, wherein the organic thin film layer is above the gate electrode, but do not necessarily indicate that the layers are immediately adjacent or that there are no intermediate layers.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein.

DESCRIPTION OF THE INVENTION

Figure 1:
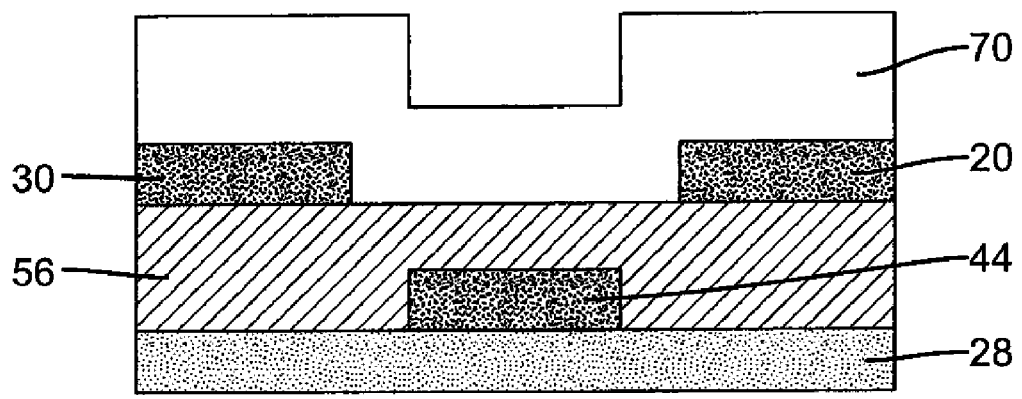
FIG. 1 illustrates a cross-sectional view of a typical organic thin film transistor having a bottom contact configuration.
Figure 2:
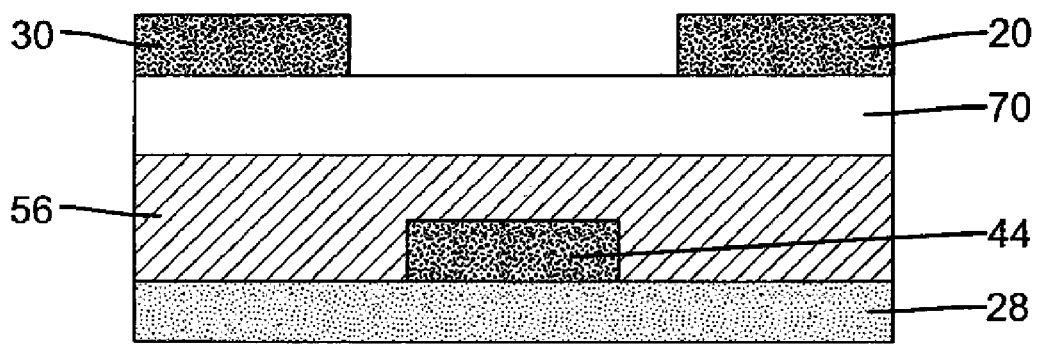
FIG. 2 illustrates a cross-sectional view of a typical organic thin film transistor having a top contact configuration.

Cross-sectional views of typical organic thin film transistor are shown in FIGS. 1 and 2, wherein FIG. 1 illustrates a typical bottom contact configuration and FIG. 2 illustrates a typical top contact configuration.

Each thin film transistor (TFT) in the embodiments of FIGS. 1 and 2 contains a source electrode 20, a drain electrode 30, a gate electrode 44, a gate dielectric 56, a substrate 28, and the semiconductor 70 of the invention in the form of a film connecting the source electrode 20 to drain electrode 30, which semiconductor comprises a compound selected from the class of N,N'-di(arylalkyl) substituted 1,4,5,8-naphthalene tetracarboxylic acid diimide compounds described herein.

When the TFT operates in an accumulation mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, Science 1995, 268, 270, hereby incorporated by reference. In the configuration of FIG. 1, the charge need only be injected laterally from the source electrode 20 to form the channel. In the absence of a gate field the channel ideally has few charge carriers; as a result there is ideally no source-drain conduction.

The off current is defined as the current flowing between the source electrode 20 and the drain electrode 30 when charge has not been intentionally injected into the channel by the application of a gate voltage. For an accumulation-mode TFT, this occurs for a gate-source voltage more negative, assuming an n-channel, than a certain voltage known as the threshold voltage. See Sze in *Semiconductor Devices—Physics and Technology*, John Wiley & Sons (1981), pages 438-443. The on current is defined as the current flowing between the source electrode 20 and the drain electrode 30 when charge carriers have been accumulated intentionally in the channel by application of an appropriate voltage to the gate electrode 44, and the channel is conducting. For an n-channel accumulation-mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 44 across the gate dielectric 56 to the semiconductor-dielectric interface, effectively charging a capacitor.

In accordance with the invention, the organic semiconductor materials used in the present invention, when used in the form of an n-channel film, can exhibit high performance under inert conditions without the need for special chemical underlayers.

The improved n-channel semiconductor film of the present invention, comprising the N,N'-di(arylalkyl) 1,4,5,8-naphthalene-based tetracarboxylic acid diimide compounds, preferably N,N'-di(phenylalkyl)-1,4,5,8-naphthalene-based tetracarboxylic acid diimide compounds, described herein, is capable of exhibiting a field effect electron mobility greater than 0.5 $cm^2/Vs$, preferably greater than 1.0 $cm^2/Vs$. Most advantageously, such mobilities are exhibited in air. In fact, the N,N'-di(arylalkyl) 1,4,5,8-naphthalene-based tetracarboxylic acid diimide compounds described have exhibited mobilities in the range of about 0.5-5.0 $cm^2/Vs$, for example about 2.5 $cm^2/Vs$, which are some of the highest thus far reported for n-channel semiconductor materials. Preferably films comprising the compounds of the present invention exhibit a field effect electron mobility that is greater than 0.01 $cm^2/Vs$, preferably greater than 0.1 $cm^2/Vs$, more preferably greater than 0.2 $cm^2/Vs$.

In addition, the n-channel semiconductor film of the invention is capable of providing on/off ratios of at least $10^4$, advantageously at least $10^5$. The on/off ratio is measured as the maximum/minimum of the drain current as the gate voltage is swept from zero to 80 volts and the drain-source voltage is held at a constant value of 80 volts, and employing a silicon dioxide gate dielectric.

Moreover, these properties are attainable after repeated exposure of the n-type semiconductor material to air, before film deposition, as well as exposure of the transistor device and/or the channel layer to air after deposition.

Without wishing to be bound by theory, there are several factors that are believed to contribute to the desirable properties of the naphthalene-based tetracarboxylic acid diimide compounds of the present invention. The solid-state structure of the material has the individual molecules packed such that the orbitals of the conjugated naphthalene core system containing the naphthalene ring system and/or the imide carboxyl groups, are able to interact with adjacent molecules, resulting in high mobility. The direction of this interaction has a component parallel to the direction of desired current flow in a device using this material as the active layer. The morphology of the films formed by the material is substantially continuous, such that current flows through the material without unacceptable interruption.

The lowest lying unoccupied molecular orbital of the compound is at an energy that allows for injection of electrons at useful voltages from metals with reasonable work functions. This conjugated structure generally has a desirable lowest unoccupied molecular orbital (LUMO) energy level of about 3.5 eV to about 4.6 eV with reference to the vacuum energy level. As known in the art, LUMO energy level and reduction potential approximately describe the same characteristics of a material. LUMO energy level values are measured with reference to the vacuum energy level, and reduction potential values are measured in solution versus a standard electrode. An advantage for device applications is that the LUMO in the crystalline solid, which is the conduction band of the semiconductor, and the electron affinity of the solid both are measured with reference to the vacuum level. The latter parameters are usually different from the former parameters, which are obtained from solution.

As indicated above, the present invention is directed to an article comprising, in a thin film transistor, a thin film of organic semiconductor material that comprises an N,N'-di(arylalkyl)-substituted naphthalene-based tetracarboxylic diimide compound having a substituted or unsubstituted carbocyclic aromatic ring system attached to each imide nitrogen atom through a divalent hydrocarbon group, wherein any optional substituents on the aryl rings comprises at least one electron donating organic group, i.e., if one or more substituents are present on one or both of the two carbocyclic ring systems, such substituents comprise at least one electron donating group. The two carbocyclic ring systems can differ, and each carbocyclic ring system can independently have different substitution or no substitution. Preferably, however, each carbocyclic ring system is the same, although the substitution on each ring system, if any, may differ. Preferably, if both carbocyclic ring systems are substituted, then both carbocyclic ring systems comprise at least one electron donating substituent group.

In one embodiment of the invention, an n-channel semiconductor film comprises an N,N'-di(arylalkyl)-substituted 1,4,5,8 naphthalene-based tetracarboxylic acid diimide compound represented by general Structure I:

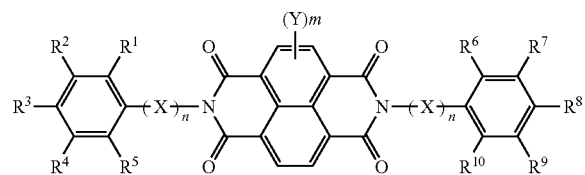

I wherein, X is a —$CH_2$— or methyl substituted —$CH_2$— divalent group, n=1, 2, or 3, and $R^1$, $R^2$, $R^3$, $R^4$, and $R^5$ (on a first phenyl ring) and $R^6$, $R^7$, $R^8$, $R^9$, and $R^{10}$ (on a second phenyl ring) are each independently H or an electron donating organic group. Preferably, $R^1$, $R^2$, $R^3$, $R^4$, $R^5$, $R^6$, $R^7$, $R^8$, $R^9$, and $R^{10}$ substituents on the phenyl rings comprise at least one electron donating substituent, more preferably an alkyl, most preferably a methyl group. Preferred organic groups include, for example, $CH_3$, linear or branched C2-C4 alkyl, alkylene (a monovalent unsaturated aliphatic hydrocarbon), and alkoxy. Accordingly, none of the $R^1$ to $R^{10}$ groups is an electronegative group such as a fluorine, trifluoromethyl or other fluorine-containing groups, nor an aryl substituent. Preferably, X is a divalent hydrocarbon group having 1 to 4 carbon atoms, more preferably 1 to 3 carbon atoms.

Preferably, in the above structure, at least one phenyl ring is substituted with a single substituent (most preferably an alkyl group) that is ortho or meta to the position of the —(X)$_n$— group in Structure I linking the phenyl and imide nitrogen. More preferably, both phenyl rings are substituted with a single substituent (most preferably an alkyl group) that is ortho or meta to the position of the —(X)$_n$— group linking the phenyl and imide nitrogen.

It is preferred that at least two of $R^1$, $R^2$, $R^3$, $R^4$ and $R^5$ are H and at least two of $R^6$, $R^7$, $R^8$, $R^9$, and $R^{10}$ are H. More preferred structures are those in which at least three of $R^1$, $R^2$, $R^3$, $R^4$ and $R^5$ are H and at least three of $R^6$, $R^7$, $R^8$, $R^9$, and $R^{10}$ are H. Preferably, at least one phenyl group is substituted with an electron donating group.

According to one embodiment, preferred structures are those in which either all of $R^1$, $R^3$, $R^4$, $R^5$, $R^6$, $R^8$, $R^9$, and $R^{10}$ are H, and at least one of, preferably both of, $R^2$ and $R^7$ is an electron-donating group, preferably an alkyl group such as $CH_3$; or all of $R^2$, $R^3$, $R^4$, $R^5$, $R^7$, $R^8$, $R^9$, and $R^{10}$ are H, and at least one of, preferably both of, $R^1$ and $R^6$ is an electron-donating group, preferably an alkyl group such as $CH_3$.

In the above Structure I, a first and second dicarboxylic imide moiety is attached on opposite sides of the naphthalene nucleus, at the 1,4 and 5,8 positions of the perylene nucleus, based on conventional numbering of the naphthalene nucleus. The naphthalene nucleus can be optionally substituted with up to four independently selected Y groups, wherein m is any integer from 0 to 4. The substituent groups Y can be an organic or inorganic group at any available position on the naphthalene nucleus. Preferably m is zero. The Y substituent groups on the naphthalene nucleus can include, for example, the following groups, which may be substituted or unsubstituted: alkyl groups, alkenyl, alkoxy groups, halogens such as fluorine or chlorine, cyano, aryl groups, arylalkyl groups, or any other groups that do not have a significantly adverse effect the n-type semiconductor properties of the film made from such compounds. It is advantageous to avoid substituents that tend to interfere with close approach of the conjugated cores of the compounds in a stacked arrangement of the molecules that is conducive to semiconductor properties. Such substituents include highly branched groups, ring structures and groups having more than 12 atoms, particularly where such groups or rings would be oriented to pose a significant steric barrier to the close approach of the conjugated cores. In addition, substituent groups should be avoided that substantially lower the solubility and/or volatility of the compounds such that the desirable fabrication processes are prevented.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituents unsubstituted form, but also its form to the extent it can be further substituted (up to the maximum possible number) with any other mentioned substituent group or groups (mentioned for the same position) so long as the substituent does not destroy properties necessary for semiconductor utility. If desired, the substituents may themselves be further substituted one or more times with acceptable substituent groups. For example, an alkyl group can be substituted with an alkoxy group, in the case of an R group ($R^1$ to $R^{10}$), or one or more fluorine atoms in the case of a Y group. When a molecule may have two or more substituents, the substituents may be joined together to form an aliphatic or unsaturated ring unless otherwise provided.

With respect to the R groups or Y groups, examples of any of the above-mentioned alkyl groups, except as otherwise indicated, are methyl, ethyl, propyl, isopropyl, butyl, isobutyl, t-butyl, pentyl, hexyl, octyl, 2-ethylhexyl, and congeners. Alkyl groups, preferably having 1 to 6 carbon atoms, more preferably 1 to 4, are intended to include branched or linear groups. Alkenyl groups can be vinyl, 1-propenyl, 1-butenyl, 2-butenyl, and congeners.

With respect to Y groups, aryl groups can be phenyl, naphthyl, styryl, and congeners. Arylalkyl groups can be benzyl, phenethyl, and congeners. Useful substituents on any of the foregoing include halogen, and alkoxy, and the like. Y substituents on the naphthalene nucleus or core can be either electron-withdrawing groups and/or electron-donating groups.

When referring to electron donating groups, this can be indicated or estimated by the Hammett substituent constant ($\sigma_p$, $\sigma_m$), as described by L. P. Hammett in *Physical Organic Chemistry* (McGraw-Hill Book Co., NY, 1940), or by the Taft polar substituent constants ($\sigma_I$) as defined by R. W. Taft in *Steric Effects in Organic Chemistry* (Wiley and Sons, NY, 1956), and in other standard organic textbooks. This parameter which characterizes the ability of ring-substituents (in the para position) to affect the electronic nature of a reaction site, were originally quantified by their effect on the pKa of benzoic acid. Subsequent work has extended and refined the original concept and data, but for the purposes of prediction and correlation, standard sets of $\sigma_p$ are widely available in the chemical literature, as for example in C. Hansch et al., *J. Med. Chem.*, 17, 1207 (1973). Preferably, an electron donating group has a $\sigma_p$ or $\sigma_m$ of less than zero, more preferably less than –0.05, most preferably less than –0.1. The $\sigma_p$ value can be used to indicate the electron donating nature of the group in a structure according to the present invention, as in Structure I above even when the group is not a para substituent in Structure I.

Specific illustrative examples of useful N,N'-substituted 1,4,5,8 naphthalene-based tetracarboxylic acid diimide derivatives are shown by the formulae below:

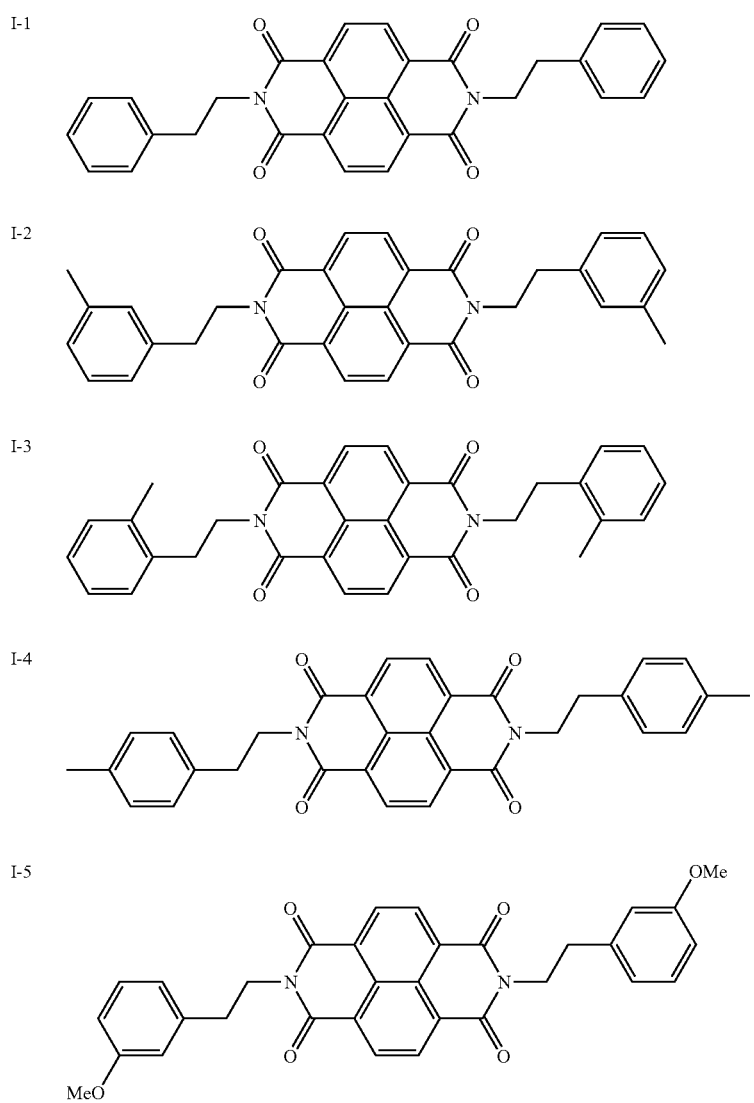

-continued
I-6
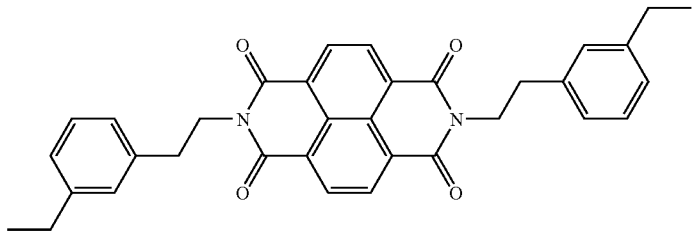
I-7
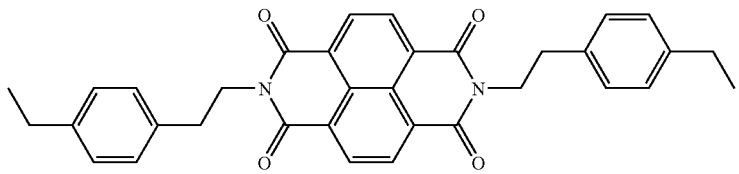
I-8
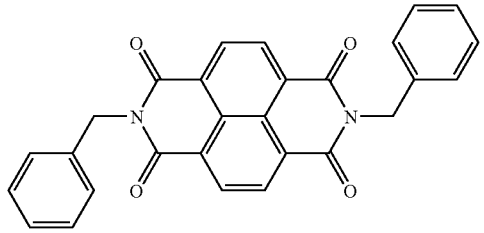
I-9
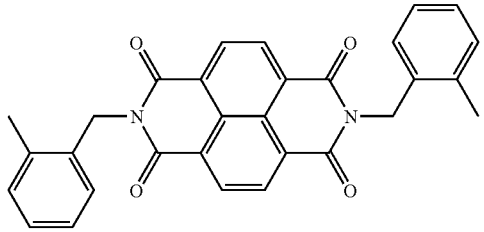
I-10
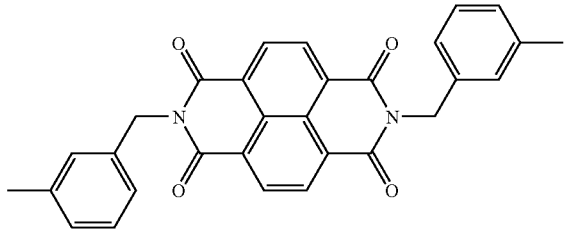
I-11
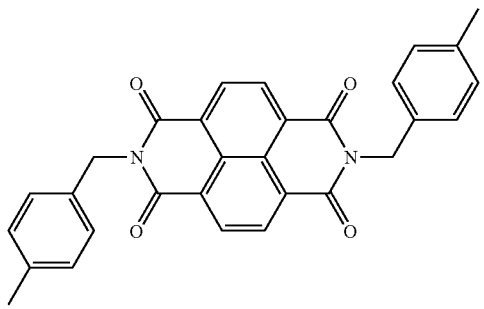

-continued

I-12
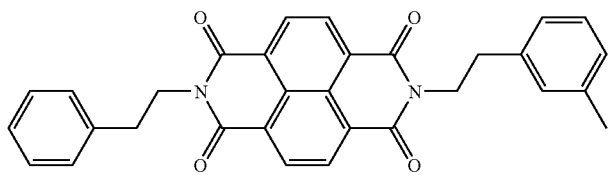

I-13
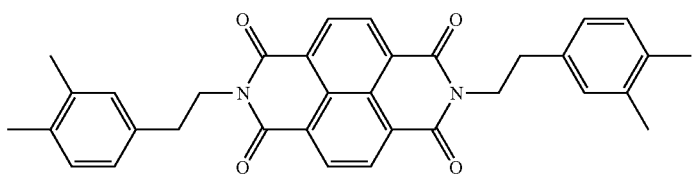

I-14
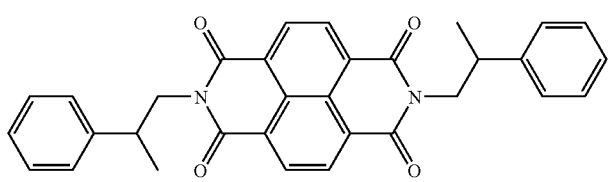

I-15
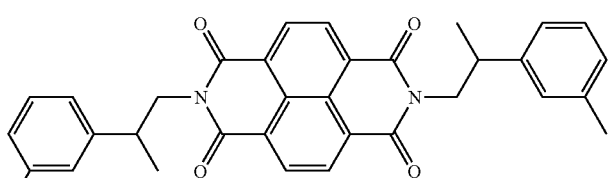

Symmetrical N,N'-dialkyl naphthalene tetracarboxylic acid diimides used in this invention are conveniently prepared by cyclizing naphthalene tetracarboxylic acid dianhydride with excess of suitable amines such as phenylethyl amine. Typical procedures are described in Eur. Pat. Appl. EP 251071 and U.S. Pat. No. 4,156,757 and in U.S. Pat. Nos. 4,578,334 and 4,719,163. Typical procedures for preparing unsymmetrical naphthalene tetracarboxylic acid diimides are described in U.S. Pat. No. 4,714,666. The crude materials were then purified by train sublimation at $10^{-5}$ to $10^{-6}$ torr.

Another aspect of the invention relates to the process for the production of semiconductor components and electronic devices incorporating such components. In one embodiment, a substrate is provided and a layer of the semiconductor material as described above can be applied to the substrate, electrical contacts being made with the layer. The exact process sequence is determined by the structure of the desired semiconductor component. Thus, in the production of an organic field effect transistor, for example, a gate electrode can be first deposited on a flexible substrate, for example an organic polymer film, the gate electrode can then be insulated with a dielectric and then source and drain electrodes and a layer of the n-channel semiconductor material can be applied on top. The structure of such a transistor and hence the sequence of its production can be varied in the customary manner known to a person skilled in the art. Thus, alternatively, a gate electrode can be deposited first, followed by a gate dielectric, then the organic semiconductor can be applied, and finally the contacts for the source electrode and drain electrode deposited on the semiconductor layer. A third structure could have the source and drain electrodes deposited first, then the organic semiconductor, with dielectric and gate electrode deposited on top.

The skilled artisan will recognize other structures can be constructed and/or intermediate surface modifying layers can be interposed between the above-described components of the thin film transistor. In most embodiments, a field effect transistor comprises an insulating layer, a gate electrode, a semiconductor layer comprising an organic material as described herein, a source electrode, and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer.

A support can be used for supporting the OTFT during manufacturing, testing, and/or use. The skilled artisan will appreciate that a support selected for commercial embodiments may be different from one selected for testing or screening various embodiments. In some embodiments, the support does not provide any necessary electrical function for the TFT. This type of support is termed a "non-participating support" in this document. Useful materials can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible support is used in some embodiments of the present invention. This allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

In some embodiments of the invention, the support is optional. For example, in a top construction as in FIG. 2, when the gate electrode and/or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, which support could be removed.

The gate electrode can be any useful conductive material. A variety of gate materials known in the art, are also suitable, including metals, degenerately doped semiconductors, conducting polymers, and printable materials such as carbon ink or silver-epoxy. For example, the gate electrode may comprise doped silicon, or a metal, such as aluminum, chromium, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide the support function of the support. For example, doped silicon can function as the gate electrode and support the OTFT.

The gate dielectric is provided on the gate electrode. This gate dielectric electrically insulates the gate electrode from the balance of the OTFT device. Thus, the gate dielectric comprises an electrically insulating material. The gate dielectric should have a suitable dielectric constant that can vary widely depending on the particular device and circumstance of use. For example, a dielectric constant from about 2 to 100 or even higher is known for a gate dielectric. Useful materials for the gate dielectric may comprise, for example, an inorganic electrically insulating material. The gate dielectric may comprise a polymeric material, such as polyvinylidenedifluoride (PVDF), cyanocelluloses, polyimides, etc. The gate electric may comprise a plurality of layers of different materials having different dielectric constants.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. In addition, polymeric materials such as polyimides, and insulators that exhibit a high dielectric constant. Such insulators are discussed in U.S. Pat. No. 5,981,970 hereby incorporated by reference.

The gate dielectric can be provided in the OTFT as a separate layer, or formed on the gate such as by oxidizing the gate material to form the gate dielectric. The dielectric layer may comprise two or more layers having different dielectric constants.

The source electrode and drain electrode are separated from the gate electrode by the gate dielectric, while the organic semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering) or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article. The present invention also provides an integrated circuit comprising a plurality of OTFTs made by the process described herein. The n-channel semiconductor material made using the above-described N,N'-substituted 1,4,5,8-naphthalene-based tetracarboxylic acid diimide compounds are capable of being formed on any suitable substrate which can comprise the support and any intermediate layers such as a dielectric or insulator material, including those known in the art.

The entire process of making the thin film transistor or integrated circuit of the present invention can be carried out below a maximum support temperature of about 450° C., preferably below about 250° C., more preferably below about 150° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive integrated circuits containing organic thin film transistors with significantly improved performance.

Compounds used in the invention can be readily processed and are thermally stable to such as extent that they can be vaporized. The compounds possess significant volatility, so that vapor phase deposition, where desired, is readily achieved. Such compounds can be deposited onto substrates by vacuum sublimation.

Deposition by a rapid sublimation method is also possible. One such method is to apply a vacuum of 35 mtorr to a chamber containing a substrate and a source vessel that holds the compound in powdered form, and heat the vessel over several minutes until the compound sublimes onto the substrate. Generally, the most useful compounds form well-ordered films, with amorphous films being less useful.

Devices in which the n-channel semiconductor films of the invention are useful include especially thin film transistors (TFTs), especially organic field effect thin-film transistors. Also, such films can be used in various types of devices having organic p-n junctions, such as described on pages 13 to 15 of US 2004,0021204 A1 to Liu, which patent is hereby incorporated by reference.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available p-type organic semiconductor materials such as pentacene. In an active matrix display, a transistor according to the present invention can be used as part of voltage hold circuitry of a pixel of the display. In devices containing the TFTs of the present invention, such TFTs are operatively connected by means known in the art.

The present invention further provides a method of making any of the electronic devices described above. Thus, the present invention is embodied in an article that comprises one or more of the TFTs described.

Advantages of the invention will be demonstrated by the following examples, which are intended to be exemplary.

EXAMPLES

A. Material Synthesis

The N,N'-di(arylalkyl)-1,4,5,8-naphthalene tetracarboxylic acid diimides used in this invention are conveniently prepared by cyclizing naphthalene tetracarboxylic acid dianhydride with excess 2-para-tolyl-ethylamine following a general method described in Rademacher, A. et al. *Chem. Ber.* 1982 115, 2927. For example, N,N'-di(4-methylphenyl) ethyl-1,4,5,8-naphthalene tetracarboxylic acid diimide (Compound I-4) used in this invention is conveniently prepared by cyclizing naphthalene tetracarboxylic acid dianhydride with excess 2-para-tolyl-ethylamine. Accordingly, a mixture of naphthalene tetracarboxylic acid dianhydride, which is available from Aldrich Chemical Company, 3-4 equivalents excess of an amine, for example 2-para-tolyl-ethylamine, also available from Aldrich, zinc acetate in catalytic amounts, and 10-15 ml of quinoline per gram of dianhydride molecule was heated over 4-5 hours at a temperature of ca. 220° C. The mixture is allowed to cool to room temperature, and the precipitated solids are collected, filtered and washed with acetone, followed by 200 ml each of boiling 0.1 M aqueous $Na_2CO_3$, boiling water, and warm toluene, that is kept below the temperature at which the product would be substantially dissolved. The solid is then purified by train sublimation at $10^{-5}$ to $10^{-6}$ torr. (As described above, other compounds are conveniently prepared by cyclizing naphthalene tetracarboxylic acid dianhydride with excess of the suitable amine.) The crude materials were then purified by train sublimation at $10^{-5}$ to $10^{-6}$ torr.

B. Device Preparation

In order to test the electrical characteristics of the various materials of this invention, field-effect transistors were typically made using the top-contact geometry. The substrate used is a heavily doped silicon wafer, which also serves as the gate of the transistor. The gate dielectric is a thermally grown $SiO_2$ layer with a thickness of 185 nm. It has been previously shown for both p-type and n-type transistors that electrical properties can be improved by treating the surface of the gate dielectric. For most of the experiments described here, the oxide surface was treated with a thin (<10 nm), spin-coated polymer layer, or a self-assembled monolayer (SAM) of octa-decyltrichlorosilane (OTS). Typically, an untreated oxide sample was included in the experiments for comparison.

The active layer of naphthalene tetracarboxylic acid diimide was deposited via vacuum deposition in a thermal evaporator. The deposition rate was 0.1 Angstroms per second while the substrate temperature was held at 90° C. for most experiments. The thickness of the active layer was a variable in some experiments, but was typically 25 nm. Silver contacts of thickness 50 nm were deposited through a shadow mask. The channel width was held at 420 microns, while the channel lengths were varied between 50 and 175 microns. Some experiments were performed to look at the effect of other contact materials. A few devices were made with a bottom-contact geometry, in which the contacts were deposited prior to the active material.

C. Device Measurement and Analysis

Electrical characterization of the fabricated devices was performed with a Hewlett Packard HP 4145b® parameter analyzer. The probe measurement station was held in a positive argon environment for all measurements with the exception of those purposely testing the stability of the devices in air. The measurements were performed under sulfur lighting unless sensitivity to white light was being investigated. The devices were exposed to air prior to testing.

For each experiment performed, between 4 and 12 individual devices were tested on each sample prepared, and the results were averaged. For each device, the drain current (Id) was measured as a function of source-drain voltage (Vd) for various values of gate voltage (Vg). For most devices, Vd was swept from 0 V to 80 V for each of the gate voltages measured, typically 0 V, 20 V, 40 V, 60 V, and 80 V. In these measurements, the gate current (Ig) was also recorded in order to detect any leakage current through the device. Furthermore, for each device the drain current was measured as a function of gate voltage for various values of source-drain voltage. For most devices, Vg was swept from 0 V to 80 V for each of the drain voltages measured, typically 40 V, 60 V, and 80 V.

Parameters extracted from the data include field-effect mobility (μ), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

Where, W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit. Mobilities can also be extracted from the linear region, where Vd≦Vg−Vth. Here the drain current is given by the equation (see Sze in *Semiconductor Devices—Physics and Technology*, John Wiley & Sons (1981)):

$$I_d = \frac{W}{L}\mu C_{ox}\left[V_d(V_g - V_{th}) - \frac{V_d^2}{2}\right]$$

For these experiments, mobilities in the linear regime were not extracted, since this parameter is very much affected by any injection problems at the contacts. In general, non-linearities in the curves of $I_d$ versus $V_d$ at low $V_d$ indicate that the performance of the device is limited by injection of charge by the contacts. In order to obtain results that are largely independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (i.e. the device is turning on).

D. Results

The following examples demonstrate that compared to N,N'-diphenyl-1,4,5,8-naphthalene tetracarboxylic acid diimide, inventive devices comprising arylalkyl-containing N,N'-substituted-1,4,5,8-naphthalene-based tetracarboxylic acid diimides provide improved n-channel semiconductor films having high mobility and on/off ratio. The mobility calculated in the saturation region was between 0.07 and 2.5 $cm^2/Vs$, with an on/off ratio of $10^4$ to $10^5$. In addition to the improved performance, the devices also show improved stability in air relative to typical n-channel TFTs, and excellent reproducibility.

Comparison Example 1

This example demonstrates the n-type TFT device made from an N,N'-diphenyl-1,4,5,8-naphthalene tetracarboxylic acid diimide C-1:

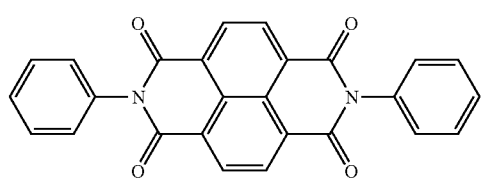

C-1

A heavily doped silicon wafer with a thermally-grown $SiO_2$ layer with a thickness of 185 nm was used as the substrate. The wafer was cleaned for 10 minutes in a piranah solution, followed by a 6-minute exposure in a UV/ozone chamber. The cleaned surface was then treated with a self-assembled monolayer of octadecyltrichlorosilane (OTS), made from a heptane solution under a humidity-controlled environment. Water contact angles and layer thicknesses were measured to ensure the quality of the treated surface. Surfaces with a good quality OTS layer have water contact angles >90°, and thicknesses determined from ellipsometry in the range of 27 Å to 35 Å.

The purified N,N'-diphenyl-1,4,5,8-naphthalene tetracarboxylic acid diimide C-1 was deposited by vacuum sublimation at a pressure of $2\times10^{-7}$ Torr and a rate of 0.1 Angstroms per second to a thickness of 25 nm as measured by a quartz crystal. During deposition the substrate was held at a constant temperature of 90° C. The sample was exposed to air for a short time prior to subsequent deposition of Ag source and drain electrodes through a shadow mask to a thickness of 50 nm. The devices made had a 420 micron channel width, with channel lengths varying from 50 to 175 microns. Multiple OTFTs were prepared and representative samples of 4 to 12 OTFTs were tested for each deposition run. The averaged results appear in Table 1 below.

The devices were exposed to air prior to measurement in an argon atmosphere using a Hewlett-Packard 4145B® semiconductor parameter analyzer. For each transistor, the field effect mobility, $\mu$, was calculated from the slope of the $(I_D)^{1/2}$ versus $V_G$ plot. The average mobility was found to be 0.064 $cm^2/Vs$ in the saturation region. The average on-off ratio was $2.3\times10^{4+}$ and the average threshold voltage was 57.3V. Saturation mobilities of up to 0.12 $cm^2/Vs$ were measured for devices prepared in this way.

Example 2

This example demonstrates the improved performance of an n-type TFT device using N,N'-di(phenylethyl)-1,4,5,8-naphthalene tetracarboxylic acid diimide, Compound I-1 in accordance with the present invention.

An n-type TFT device comprising Compound I-1 as the active material was made as in Example 1. Accordingly, compound I-1 was deposited by vacuum sublimation at a pressure of $2\times10^{-7}$ Torr and a rate of 0.1 Angstroms per second to a thickness of 25 nm as measured by a quartz crystal. During deposition the substrate was held at a constant temperature of 90° C. The sample was exposed to air for a short time prior to subsequent deposition of Ag source and drain electrodes through a shadow mask to a thickness of 50 nm. The devices made had an approximately 420 micron channel width, with channel lengths varying from 50 to 175 microns. Multiple organic thin film transistors (OTFTs) were prepared and representative sample of 4 to 12 OTFTs were tested for each deposition run. The averaged results appear in Table 1 below.

The devices were exposed to air prior to measurement in an argon atmosphere using a Hewlett-Packard 4145B® semiconductor parameter analyzer. The average field effect mobility, $\mu$, was calculated from the slope of the $(I_D)^{1/2}$ versus $V_G$ plot to be 0.13 $cm^2/Vs$ in the saturation region. The average on/off ratio was $4.8\times10^4$ and the average threshold voltage $V_T$=61.3 V. Saturation mobilities of up to 0.46 $cm^2/Vs$ were measured from similar devices prepared in this way.

TABLE 1

| Active OTFT Material | $\mu$ ($cm^2/Vs$) | $\sigma$ ($\mu$) | $V_{th}$ (V) | $\sigma$ ($V_{th}$) | $I_{on}/I_{off}$ |
|---|---|---|---|---|---|
| Comparison Example 1 | C-1 | 0.064 | 0.037 | 57.3 | 3.6 | $2.3 \times 10^4$ |
| Inventive Example 2 | I-1 | 0.132 | 0.170 | 61.25 | 3.91 | $4.78 \times 10^4$ |

This example clearly demonstrates the advantage of using Compound I-1 as n-type material. The mobility is improved over Comparison Example 1, clearly demonstrating the effect of —$CH_2$—$CH_2$— groups between diimide nitrogen and phenyl ring on device performance.

Example 3

This example demonstrates the improved performance n-type TFT device made from a fluorine-containing N,N'-di (4-methylphenyl)ethyl-1,4,5,8-naphthalene tetracarboxylic acid diimide, Compound I-4. An n-type TFT device using compound I-4 as the active material of the OTFT was made as in Example 1. Multiple OTFTs were prepared and tested for each deposition run. The averaged results appear in Table 2 below.

TABLE 2

| Active OTFT Material | μ (cm²/Vs) | σ (μ) | $V_{th}$ (V) | σ ($V_{th}$) | $I_{on}/I_{off}$ |
|---|---|---|---|---|---|
| Comparative Example 1 | C-1 | 0.064 | 0.037 | 57.3 | 3.6 | 2.3 × 10⁴ |
| Inventive Example 3 | I-4 | 0.143 | 0.076 | 55.8 | 2.5 | 3.0 × 10⁴ |

This example clearly demonstrates the advantage of Compound I-4 as n-type material. The mobility is improved over Comparative Example 1, clearly demonstrating the beneficial effect of the (4-methylphenyl)ethyl groups on device performance.

Example 4

This example demonstrates the improved performance n-type TFT device made from N,N'-di(3-methylbenzyl)-1,4,5,8-naphthalene tetracarboxylic acid diimide, Compound I-10. An n-type TFT device using Compound I-10 as the active material of the OTFT was made as in Example 1. Multiple OTFTs were prepared and tested for each deposition run. The averaged results appear in Table 3 below.

TABLE 3

| Active OTFT Material | μ (cm²/Vs) | σ (μ) | $V_{th}$ (V) | σ ($V_{th}$) | $I_{on}/I_{off}$ |
|---|---|---|---|---|---|
| Comparison Example 1 | C-1 | 0.064 | 0.037 | 57.3 | 3.6 | 2.3 × 10⁴ |
| Inventive Example 4 | I-10 | 0.07 | 0.035 | 53.6 | 2.0 | 5.4 × 10⁴ |

This example clearly demonstrates the advantage of Compound I-10 as n-type material. From the slope of the $(I_D)^{1/2}$ versus $V_G$ plot saturation region mobilities of up to 0.12 cm²/Vs were measured from similar devices prepared in this way.

Example 5

This example demonstrates the improved performance n-type TFT device made from N,N'-di(2-phenyl-propyl)-1,4,5,8-naphthalene tetracarboxylic acid diimide, Compound I-15. An n-type TFT device using Compound I-15 as the active material of the OTFT was made as in Example 1. Multiple OTFTs were prepared and tested for each deposition run. The averaged results appear in Table 4 below.

TABLE 4

| Active OTFT Material | μ (cm²/Vs) | σ (μ) | $V_{th}$ (V) | σ ($V_{th}$) | $I_{on}/I_{off}$ |
|---|---|---|---|---|---|
| Comparison Example 1 | C-1 | 0.064 | 0.037 | 57.3 | 3.6 | 2.3 × 10⁴ |
| Inventive Example 4 | I-15 | 0.098 | 0.035 | 52.5 | 3.1 | 4.9 × 10⁴ |

This example clearly demonstrates the advantage of Compound I-15 as n-type material. From the slope of the $(I_D)^{1/2}$ versus $V_G$ plot saturation region mobilities of up to 0.14 cm²/Vs were measured from similar devices prepared in this way.

Example 6

This example demonstrates the improved performance n-type TFT device made from N,N'-di(3-methylphenyl) ethyl-1,4,5,8-naphthalene tetracarboxylic acid diimide, Compound I-2. An n-type TFT device using Compound I-2 as the active material of the OTFT was made as in Example 1. Multiple OTFTs were prepared and tested for each deposition run. The averaged results appear in Table 5 below.

TABLE 5

| Active OTFT Material | μ (cm²/Vs) | σ (μ) | $V_{th}$ (V) | σ ($V_{th}$) | $I_{on}/I_{off}$ |
|---|---|---|---|---|---|
| Comparison Example 1 | C-1 | 0.064 | 0.037 | 57.3 | 3.6 | 2.3 × 10⁴ |
| Inventive Example 4 | I-2 | 2.47 | 0.736 | 44.0 | 8.4 | 7.0 × 10⁵ |

This example clearly demonstrates the advantage of Compound I-2 as n-type material. From the slope of the $(I_D)^{1/2}$ versus $V_G$ plot saturation region mobilities of up to 3.3 cm²/Vs were measured from similar devices prepared in this way.

PARTS LIST 20 source electrode
28 substrate
30 drain electrode
44 gate electrode
56 gate dielectric
70 semiconductor

The invention claimed is:

1. An article comprising, in a thin film transistor, a thin film of organic semiconductor material that comprises an N,N'-di (arylalkyl)-substituted naphthalene tetracarboxylic diimide compound having a substituted or unsubstituted carbocyclic aromatic ring system attached to each imide nitrogen atom through a divalent hydrocarbon group, wherein substituents, if any, on each carbocyclic aromatic ring system are independently selected electron donating organic substituents, wherein said compound is represented by the following structure:

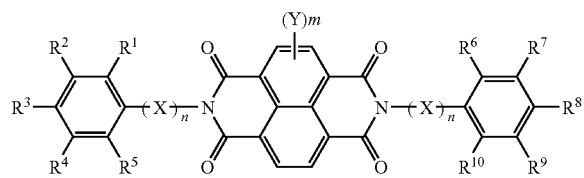

wherein, X is a —CH₂— or alkyl substituted —CH₂— divalent group, m is 0, n is 2 or 3, and
wherein in said structure all of R¹, R³, R⁴, R⁵, R⁶, R⁸, R⁹, and R¹⁰ are H, and at least one of R² and R⁷ is an alkyl group.

2. The article of claim 1 wherein the thin film transistor is a field effect transistor comprising a dielectric layer, a gate electrode, a source electrode and a drain electrode, and wherein the dielectric layer, the gate electrode, the thin film of organic semiconductor material, the source electrode, and the drain electrode are in any sequence as long as the gate electrode and the film of organic semiconductor material both contact the dielectric layer, and the source electrode and the drain electrode both contact the thin film of the organic semiconductor material.

3. The article of claim 2, wherein the gate electrode is adapted for controlling, by means of a voltage applied to the gate electrode, a current between the source and drain electrodes trough the thin film of organic semiconductor material.

4. The article of claim 3 wherein the gate dielectric comprises an inorganic or organic electrically insulating material.

5. The article of claim 2 wherein the source, drain, and gate electrodes each independently comprise a material selected from doped silicon, metal, and a conducting polymer.

6. The article of claim 1 wherein the thin film of organic semiconducting material is capable of exhibiting electron mobility greater than 0.01 cm²/Vs.

7. The article of claim 1, wherein the thin film transistor has an on/off ratio of a source/drain current of at least $10^4$.

8. The article of claim 1 wherein the thin film transistor further comprises a non-participating support.

9. An electronic device selected from the group consisting of integrated circuits, active-matrix display, and solar cells comprising a multiplicity of thin film transistors according to claim 1.

10. The electronic device of claim 9 wherein the multiplicity of the thin film transistors is on a non-participating support.

11. An article comprising, in a thin film transistor, a thin film of organic semiconductor material that comprises an N,N'-di(arylalkyl)-substituted naphthalene tetracarboxylic diimide compound having a substituted carbocyclic aromatic ring system attached to each imide nitrogen atom through a divalent hydrocarbon group, wherein said compound is represented by the following structure:

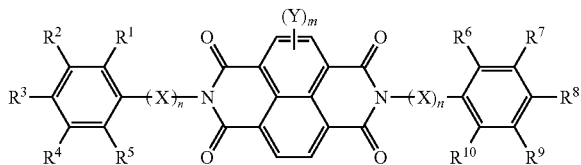

wherein, X is a —$CH_2$— or alkyl substituted —$CH_2$— divalent group, m is 0, n is 2 or 3, and wherein in said structure all of $R^1$, $R^3$, $R^4$, $R^5$, $R^6$, $R^8$, $R^9$, and $R^{10}$ are H, and at least one of $R^2$ and $R^7$ is an alkyl group.

* * * * *